(12) United States Patent
Köhler et al.

(10) Patent No.: US 8,487,323 B2
(45) Date of Patent: Jul. 16, 2013

(54) LED HOUSING SYSTEM

(75) Inventors: Steffen Köhler, Penang (MY); Stefan Grötsch, Lengfeld-Bad Abbach (DE); Herbert Brunner, Sinzing (DE); Rainer Huber, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 129 days.

(21) Appl. No.: 12/675,009

(22) PCT Filed: Aug. 6, 2008

(86) PCT No.: PCT/DE2008/001293
§ 371 (c)(1),
(2), (4) Date: Mar. 29, 2011

(87) PCT Pub. No.: WO2009/026876
PCT Pub. Date: Mar. 5, 2009

(65) Prior Publication Data
US 2011/0186880 A1    Aug. 4, 2011

(30) Foreign Application Priority Data
Aug. 30, 2007    (DE) .................. 10 2007 041 136

(51) Int. Cl.
*H01L 33/62*    (2010.01)
*F21V 21/005*    (2006.01)

(52) U.S. Cl.
USPC ............ 257/88; 257/59; 257/72; 257/99; 362/249.01; 362/800; 340/815.73

(58) Field of Classification Search
USPC ............ 257/678, 177, 659, 685, 692, 704, 257/710, 712, 723; 362/249.01, 800; 340/815.73
See application file for complete search history.

(56) References Cited

U.S. PATENT DOCUMENTS

| | | | | |
|---|---|---|---|---|
| 4,423,465 A | * | 12/1983 | Teng-Ching et al. | 361/730 |
| 4,667,277 A | * | 5/1987 | Hanchar | 362/249.01 |
| 6,422,716 B2 | | 7/2002 | Henrici et al. | |
| 6,608,334 B1 | * | 8/2003 | Ishinaga | 257/100 |
| 6,911,731 B2 | * | 6/2005 | Wu | 257/727 |
| 7,458,705 B2 | | 12/2008 | Chiba et al. | |
| 7,880,283 B2 | * | 2/2011 | Zhuang | 257/678 |
| 7,963,669 B2 | * | 6/2011 | Hockel et al. | 362/249.02 |
| 2004/0227146 A1 | | 11/2004 | Wu | |
| 2006/0102917 A1 | * | 5/2006 | Oyama et al. | 257/99 |
| 2006/0226531 A1 | * | 10/2006 | Passe et al. | 257/691 |

(Continued)

FOREIGN PATENT DOCUMENTS

| | | |
|---|---|---|
| CN | 1917731 | 2/2007 |
| DE | 198 18 402 | 10/1999 |

(Continued)

OTHER PUBLICATIONS

OSTAR®—Lighting Application Note, pp. 1-15, May 2006.

*Primary Examiner* — Zandra Smith
*Assistant Examiner* — Tsz Chiu
(74) *Attorney, Agent, or Firm* — Cozen O'Connor

(57) ABSTRACT

An LED housing having a housing cavity, a carrier element, LED chips, the LED housing being formed in such a way that it may connect a plurality of LED housings of identical construction and, by its shaping, is additionally mountable in various ways.

12 Claims, 10 Drawing Sheets

U.S. PATENT DOCUMENTS

| | | | |
|---|---|---|---|
| 2006/0262533 A1 | 11/2006 | Lin et al. | |
| 2007/0034775 A1 | 2/2007 | Cheng et al. | |
| 2007/0064450 A1* | 3/2007 | Chiba et al. | 362/655 |
| 2007/0184722 A1* | 8/2007 | Doherty | 439/638 |
| 2008/0036397 A1* | 2/2008 | Hockel et al. | 315/294 |
| 2008/0200061 A1* | 8/2008 | Lee | 439/427 |
| 2008/0220549 A1* | 9/2008 | Nall et al. | 438/26 |

FOREIGN PATENT DOCUMENTS

| | | |
|---|---|---|
| DE | 198 53 424 | 6/2000 |
| DE | 203 11 557 | 10/2003 |
| DE | 102 42 292 | 4/2004 |
| DE | 11 2004 001 108 | 10/2006 |
| EP | 1 134 849 | 9/2001 |
| JP | 56-10983 | 2/1981 |
| JP | 56-012368 | 2/1981 |
| JP | 61-053807 | 4/1986 |
| JP | 61-195076 | 12/1986 |
| JP | 63-138537 | 6/1988 |
| JP | 2000-183406 | 6/2000 |
| JP | 2003-0179264 | 6/2003 |
| JP | 2006-278934 | 10/2006 |
| JP | 2006-344420 | 12/2006 |
| JP | 2007-208203 | 8/2007 |
| JP | 2007-213881 | 8/2007 |
| JP | 2007-311786 | 11/2007 |
| JP | 2008-159394 | 7/2008 |
| WO | WO 2005/015077 | 2/2005 |
| WO | WO 2007/069130 | 6/2007 |

* cited by examiner

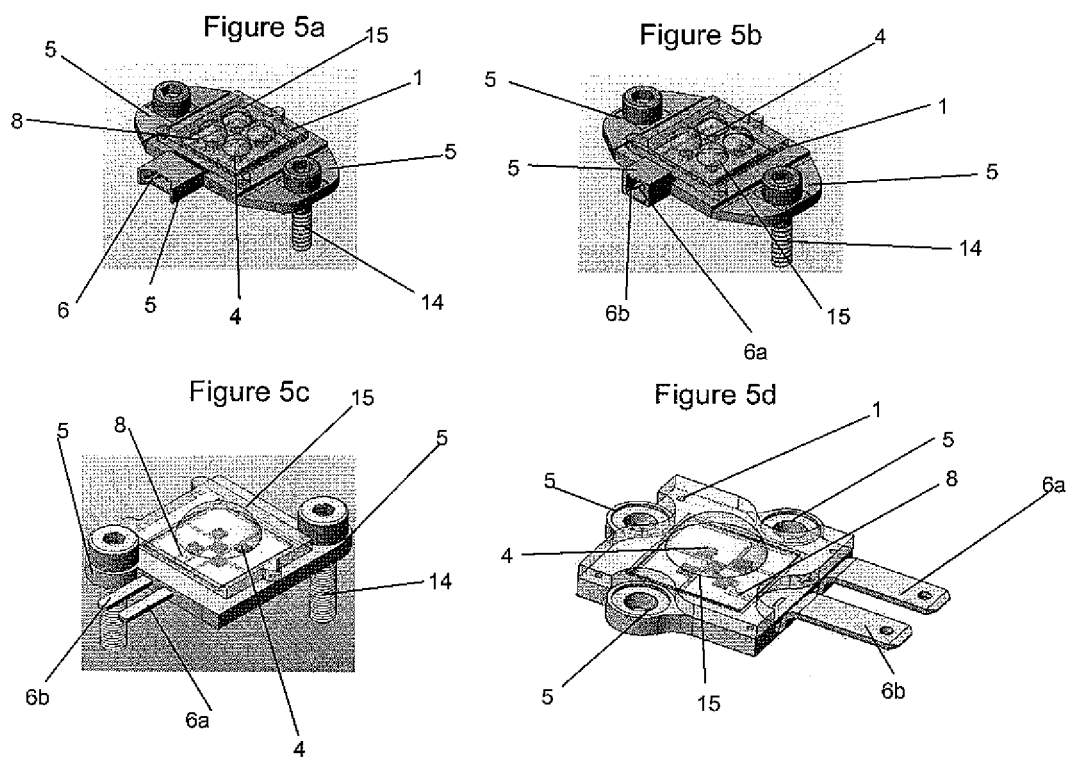

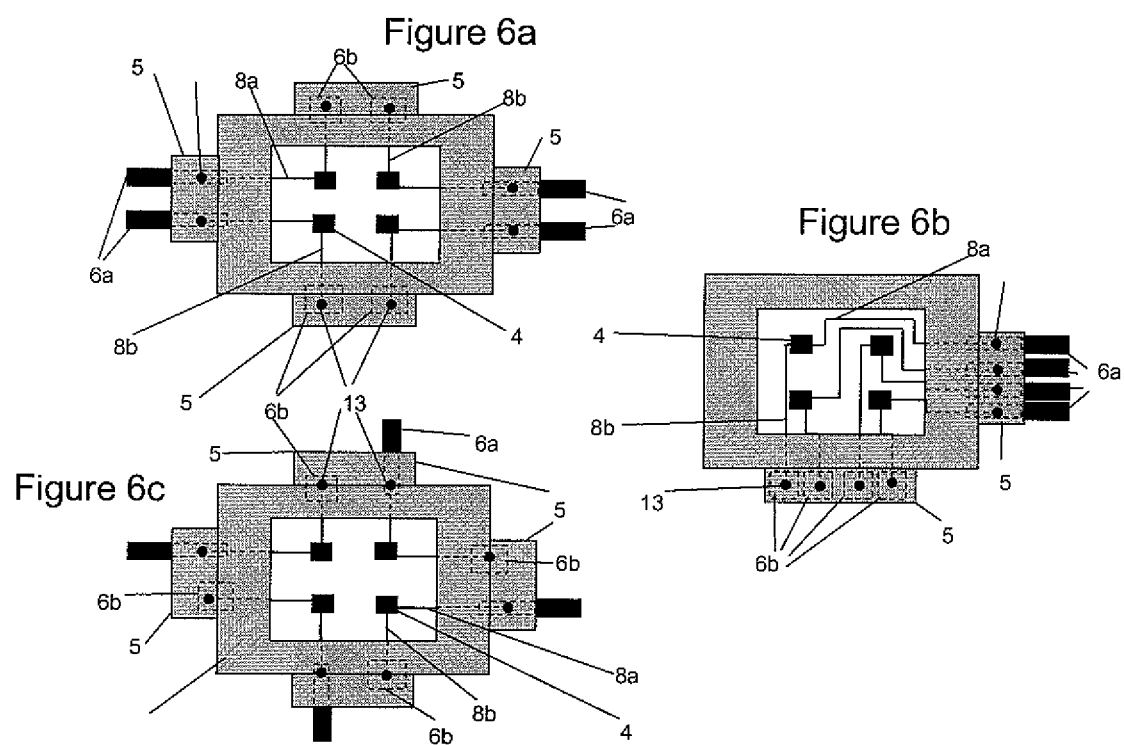

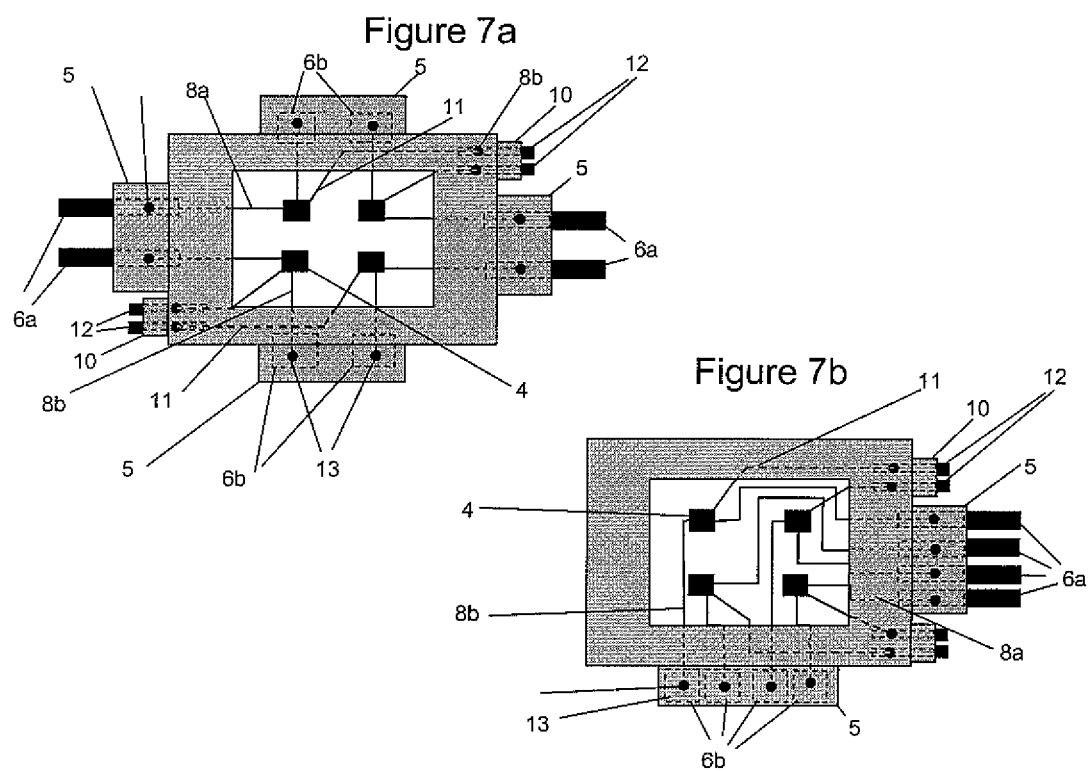

US 8,487,323 B2

LED HOUSING SYSTEM

RELATED APPLICATIONS

This is a U.S. national stage of application No. PCT/DE2008/001293, filed on Aug. 6, 2008.

This application claims the priority of Germany application no. 10 2007 041 136.9 filed Aug. 30, 2007, the entire content of which is hereby incorporated by reference.

FIELD OF THE INVENTION

The invention relates to an LED housing having a housing cavity, a carrier element, an LED chip, a retaining element and at least one housing terminal element, the housing being configured in such a way that it may be extended in modular manner by a second LED housing of like construction. Furthermore, the housing may be mounted in different ways on a carrier and exhibits optimum heat dissipation.

BACKGROUND OF THE INVENTION

Light-emitting diodes (LEDs), also known as luminescent diodes, are optoelectronic components which when in operation emit electromagnetic radiation with wavelengths in the ultraviolet, infrared or indeed in the part of the electromagnetic spectrum perceptible to the human eye.

Furthermore, they have numerous potential uses. For example, typical high power light-emitting diodes already produce a light intensity of several watts and are thus suitable and usable as headlights and for projection lighting. On the other hand, LEDs are used as status indicators, luminescent devices of the most varied wavelengths, warning lamps, for data transmission, in display elements and for many other purposes.

To produce the electromagnetic radiation, light-emitting diodes in special semiconductor lattice structures in particular make use of the energy gap between the conduction band and the valence band. The difference between the energy levels of the valence band and the conduction band is here understood as a band gap, wherein, in the case of semiconductor materials with direct band transition, the highest energy state in the valence band lies directly below the lowest energy state of the conduction band. Through energy input, electrons change from the lower energy state of the valence band to the higher energy state of the conduction band. On recombination of these electrons into the valence band the electrons release this introduced energy in the form of electromagnetic radiation of a specific wavelength.

By introducing a luminescence conversion element into the beam path of the emitting semiconductor, it is possible to convert the primarily produced wavelength into a secondary wavelength. It is thus simply possible to generate mixed light, for example white light or light of a particular wavelength which does not correspond to the band gap of the semiconductor in question.

A light-emitting diode may be mounted in different ways. On the one hand LEDs may be mounted on a printed circuit board using surface mount technology (SMT). This space-saving variant saves on additional contact pins in the case of special shapes, since the electrical terminal may be fitted to an outer side of the housing in the form of a pad or an electrically conductive plate and comprises an electrical connection to the semiconductor chip inside the housing.

A further variant for mounting light-emitting diodes involves providing the LED housing with contact pins for mounting on a perforated printed circuit board. For this purpose, the terminals provided for electrical operation must be specially configured. In this case, a light-emitting diode chip is introduced into a housing, preferably a casting compound which is partially transparent to the emitting wavelength.

Electrical connection of the emitting chip is then effected by way of additional discrete contact pins extending out of the housing.

For those instances in which light-emitting diodes are not mounted directly on printed circuit boards, since they may possibly be used relatively far away therefrom, such as for example in appliance fronts, or in a primitive application in which a printed circuit board design would not be convenient, there are LED auxiliary elements, for example socket adapters, which electrically and/or mechanically connect a conventional LED by means of plug-and-socket systems and/or holders.

In order to increase luminance for an application, a plurality of light-emitting diodes are for example placed and mounted together on a printed circuit board. In the field of projection technology, backlighting is for example produced for liquid crystal screens, or liquid crystal displays (LCD), by means of a white light LED matrix, a matrix of a plurality of white light LEDs serving as backlighting.

A disadvantage of all these methods is that additional elements, such as terminal elements in general or adapters, are required to operate a light-emitting diode. Added to this is the disadvantage that an LED which has been manufactured for a particular type of mounting can only be used to a limited extent for further mounting methods. Finally, an assembly of LEDs can likewise only be produced using additional elements. This means that losses arise due to additional evolution of heat and a greater space requirement.

SUMMARY OF THE INVENTION

One object of the invention is to provide an LED housing which can be mounted in different ways and may moreover be extended in modular manner with a further LED housing of like construction.

This and other objects are attained in accordance with one aspect of the present invention directed to an LED housing which comprises a housing cavity, a carrier element, at least one LED chip, at least one retaining element and at least one housing terminal element. The carrier element is here populated on a first upper side with at least one LED chip and arranged inside the housing cavity in the LED housing. Furthermore, the LED housing is shaped in such a way that the at least one housing terminal element is arranged on an outer side of the LED housing and is electrically connected to the at least one LED chip for operating this LED chip and furthermore the LED housing may be connected mechanically detachably to a second LED housing of identical construction.

"Mechanically detachably" may here mean that the connection may be undone by the application of mechanical force, the connection preferably being capable of being undone nondestructively, such that after two LED housings of identical construction have been detached from one another at least one of the LED housings may be used again.

The above-described subject matter provides an LED housing which may be used flexibly for a very wide range of mounting variants, is flexibly electrically connectable and furthermore may be connected mechanically or extended without additional elements with a further LED housing of identical construction.

In an advantageous configuration of the invention the LED housing may be mechanically connected mechanically detachably with a carrier by means of at least one retaining element. A carrier for the purposes of the invention is for example a cooling element, a board or in general a heat sink. The carrier may generally take the form of a base member which provides the LED housing with sufficient retention force for its specific application. By configuring the LED housing in this universal form it is possible, on the basis merely of a characteristic LED housing form, to bring about a plurality of light-emitting diode mounting methods without needing additional elements.

If, in one particular configuration, the carrier is a heat sink, then as a result of its good thermal conductivity it ensures sufficiently good outward heat transfer and thereby prevents destruction of the LED chip within the housing cavity.

Sufficient retention force for the mechanical connection with the carrier is here achieved by at least one retaining element. The retaining element is either part of the LED housing or attached to the LED housing as an additional element. In its simplest form, a retaining element may here be for example a hole introduced into the LED housing, through which a mechanical connecting element, for example a screw or a retaining pin, is guided. The retaining element is here either attached to the LED housing as a separate element or formed as part of the housing.

In a further advantageous configuration the LED housing comprises mechanical and/or electrical connection to an LED housing of identical construction by at least one retaining element. In this way a stable mechanical connecting force and an electrically conductive connection between two LED housings is provided, without the need for further additional elements, for example carrier elements.

In a further advantageous configuration the LED housing additionally comprises a heat dissipating element, which is situated at least on a second side of the carrier element. This second side is opposite the first, upper side of the carrier element. This heat dissipating element provides improved outward heat transfer from the inside of the housing cavity outwards, whereby for example high power light-emitting diode chips are protected from overheating and thus the risk of destruction.

Advantageously, the retaining element is of multipart construction, and the housing terminal element is incorporated into at least one part of the retaining element. This makes possible universal modular extension by an LED housing of identical construction or a carrier, wherein at least one part of the retaining element likewise provides the electrical connection between the LED chips. Furthermore, the force for mechanical connection to a carrier or a second LED housing is produced by the retaining element. Ideally, the retaining element is then of one-part construction and thus produces the electrical and mechanical connection by way of a plug-and-socket system. This measure permits quick extension of an LED housing.

In a further advantageous configuration the housing terminal element comprises at least one anode terminal element and one cathode terminal element. These two terminal elements may advantageously take the form of a mechanical and/or electrical plug-and-socket system, wherein the anode terminal element is for example a socket and the cathode terminal element is for example a plug or vice versa. This configuration makes it very simply possible to extend an LED housing with an additional LED housing or to connect an LED housing to a carrier. This makes it possible to increase light intensity without additional elements. Furthermore, it is thereby simply possible to introduce an additional colour into an LED housing arrangement. A multicolour, highly luminous LED configuration may thus be achieved by a simple plug-and-socket system. In this case, the cathode terminal of the first LED housing is then connected to the anode terminal of the second LED housing for possible LED series connection.

In a further advantageous configuration the housing cavity of the LED housing comprises a plurality of LED chips. In this first embodiment, these LED chips are series-connected, each anode terminal of an LED chip being connected to a cathode terminal of a neighbouring LED chip. A first anode terminal, which serves as a common anode terminal of the LED housing, and a final cathode terminal, which serves as a common cathode terminal of the LED housing, are guided to the housing terminal element of the LED housing. Thus all the LED chips inside this LED housing may be controlled electrically by way of a common housing terminal element which is of multipart construction in a special embodiment. In this configuration the emitted light intensity of an individual LED housing increases immensely. Furthermore, it is possible to produce mixed colours inside an LED housing, each LED chip emitting a specific wavelength; in the example of a mixed light lamp, for example, a white light could be produced, which is very simply possible by combining the colours red, green and blue.

In a further advantageous configuration the housing terminal element may be electrically controlled by way of plug connectors or latching connectors, the LED housing being in principle SMT-mounted. In this configuration good heat dissipation to the SMT board is obtained, on which in turn a heat sink may additionally be present, for example in the form of a cooling element. Furthermore, flexible electrical connection of the LED housing is achieved thereby. In a further configuration of this embodiment the housing terminal element is also SMT-mounted, whereby electrical connection likewise proceeds via the SMT board. The same obviously applies to other mounting methods.

In an advantageous configuration a control terminal element is additionally fitted to the LED housing. This control terminal element comprises an electrical connection to at least one control element inside the housing cavity. This control element in turn controls the intensity of the emitted electromagnetic radiation of one of the LED chips inside the housing cavity. This embodiment makes it possible to control each individual LED chip separately and for example to carry out particular colour adjustment or to provide individual light intensity for each LED housing by means of a pulse width-modulated (PWM) signal.

In a further advantageous configuration the terminals of each LED chip are guided individually to the housing terminal element. In this way each LED chip may be separately controlled and thus switched on and off. In this configuration it is possible to control and switch on and off each of the LED chips independently of the other LED chips in an LED housing.

In an advantageous configuration of the invention the carrier element is a Direct Bonded Copper (DBC) ceramic substrate. This type of substrate, which is a "sandwich structure" of copper-ceramic-copper, effects electrical insulation. In addition, this type of substrate effects laterally spread heat removal, so resulting in good heat dissipation. In addition, this substrate is electrically highly conductive.

In a further advantageous configuration the carrier substrate is a metallic carrier, for example copper or copper alloy with a metallic bonding coating. In this instance, the backs of the LED chips have to be configured to provide electrical insulation.

Connection of the LED chip to the housing terminal element preferably proceeds by laser welding and/or bonding methods. In this way, quicker manufacture may be achieved.

In a further advantageous configuration the LED housing additionally comprises an optical element, or mounts for such an optical element, for example a lens or a lens-type encapsulation. This optical element makes it possible to achieve beam focussing, beam expansion or generally beam deflection. In this way, a purposeful LED radiation pattern is achieved.

In a further advantageous configuration the LED housing is made from a casting compound material. This casting compound material is liquid during the production process and is shaped by matrix moulding into the desired LED housing shape.

In a further advantageous configuration at least one part of the retaining element is shaped separately or in standardised manner with the housing terminal elements. As a result of the standardised shaping, as may be found in many fields, for example the automotive field, the largest possible field of use may be achieved for this LED housing.

The electrical and/or mechanical series connection according to the invention of a plurality of LED housings is brought about for example by plug connection, latching or indeed screws. Furthermore parallel connection of this LED housing is also conceivable, this being achievable using an additional adapter. This adapter is fitted for example between two anode terminal elements and serves in electrical bridging. Furthermore, the adapter serves as a spacer between the parallel-connected LED housings.

If each LED chip terminal is separately guided to the LED housing terminal element, an additional bridge adapter is likewise covered by the scope of the invention. This bridge adapter serves in series connection of the LED chips outside the LED housing, if they are not provided for connection with further LED housings.

BRIEF DESCRIPTION OF THE DRAWINGS

The invention is explained below by means of exemplary embodiments and with reference to the drawings, identical or identically acting components being labelled in the Figures in each case with identical reference numerals. The elements shown should not be considered to be to scale, but rather individual elements may be shown exaggeratedly large or exaggeratedly simple manner to assist in understanding.

In the drawings:

FIG. 5 is a 3D representation of an embodiment of the LED housing in various further developments a-d, FIG. 6 shows a further development of the embodiment of the LED housing shown in FIG. 2, FIG. 7 shows a further development of the embodiment of the LED housing shown in FIG. 6.

DETAILED DESCRIPTION OF THE DRAWINGS

Figure 1A:
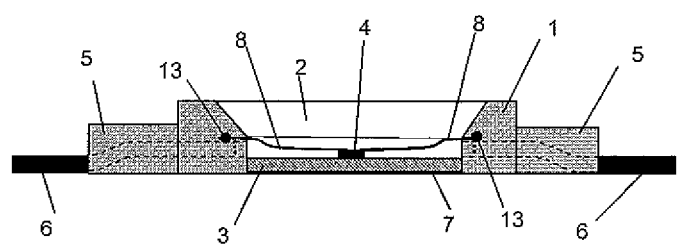
FIG. 1 shows in a) a section through a schematically illustrated exemplary embodiment of an LED housing and in b) a plan view of the exemplary embodiment shown in a)

FIG. 1a is a cross-section of a schematic representation of an exemplary embodiment of an LED housing. The LED housing 1 comprises a housing cavity 2. Inside the housing cavity 2 there is located a carrier element 3, on an upper side of which there is arranged an LED chip 4. On the side opposite the upper side there is arranged a thermally conductive element 7. The LED housing 1 further comprises retaining elements 5 and housing terminal elements 6, which are located on two outer sides of the LED housing 1. The housing terminal elements 6 in turn comprise an electrical connection 8 to the LED chip 4, a bond connection 13 connecting the electrical connection 8, for example in the form of bonding wire, to the housing terminal element 6.

The LED housing 1 may be mounted in any desired way on a carrier by means of the retaining elements 5 and the housing terminal elements 6. Each retaining element 5 may take the form of part of the LED housing 1, or of a separate element on the LED housing 1 during a manufacturing process.

Figure 1B:
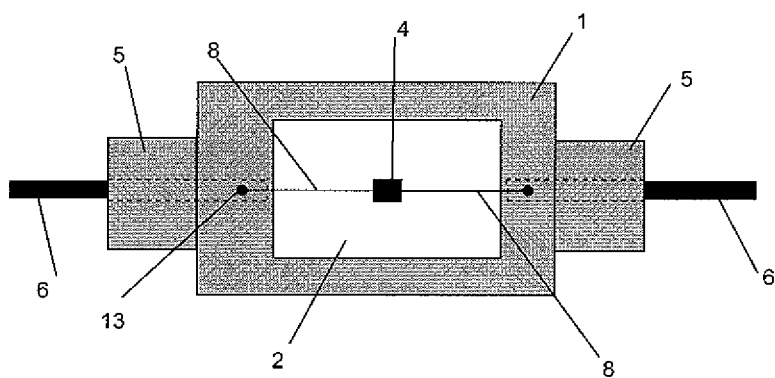

FIG. 1b shows a plan view of the LED housing 1 illustrated in FIG. 1a. As is clear, the LED housing may be mounted both electrically and mechanically by SMT. The housing terminal elements in particular are connected to a control circuit by means of soldering methods. In this embodiment it is additionally possible to produce a plug-and-socket connection with each housing terminal element 6 via a plug-and-socket system. A mating component, not shown, may be connected to the retaining element 5 and the housing terminal element 6 by suitable shaping, the retaining element 5 generating additional retention force. This mating component additionally makes board mounting feasible, without requiring a soldered joint. Furthermore, the housing terminal elements of identical LED housings 1 may be connected together by means of this mating component.

The heat-dissipating element 7 serves in particular in the case of high power LEDs in improved outward heat transfer from the inside of the LED housing 1 and protects the LED chip 4 from overheating and destruction. Advantageously the LED housing 1 is mounted on a heat sink, whereby outward heat transfer may be improved substantially.

Figure 2A:
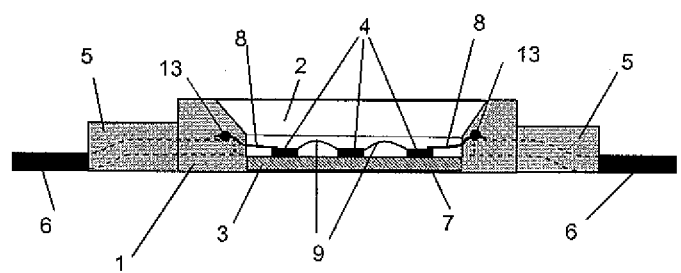
FIG. 2 shows a further development of the embodiment of the LED housing shown in FIG. 1.

FIG. 2 shows a further development of the embodiment of the LED housing shown in FIG. 1. The structure is comparable in principle to the exemplary embodiment of FIG. 1, whereby only the differences from the embodiment shown in FIG. 1 will be examined here. Unlike in FIG. 1, a plurality of series-connected LED chips 4 is introduced into the housing cavity 2. The housing terminal element 6 comprises an electrical connection 8 to one of the LED chips 4, wherein the LED chips 4 are interconnected in series. To this end, all the anode terminals of an LED chip 4 are connected to a cathode terminal of the next LED chip 4 located in the cavity 2 by means of an intermediate bond connection 9. Only the anode terminal of the first LED chip 4 of the series connection and the cathode terminal of the last LED chip 4 of the series connection are not connected, but instead in each case connected electrically to the housing terminal element 6 by means of bond connection 13.

Figure 2B:
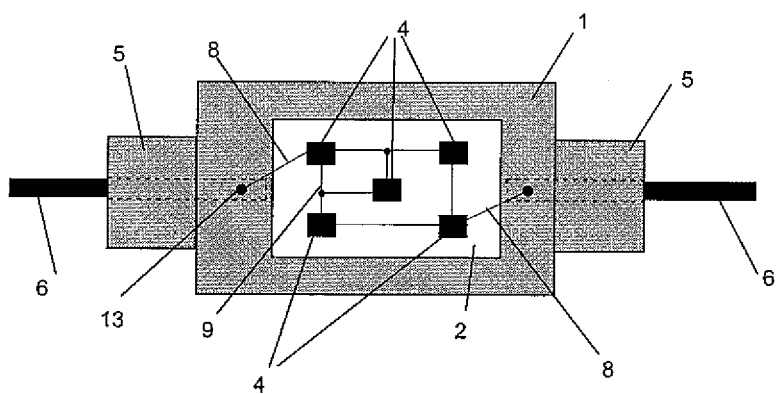

Clarification of the series connection of the LED chip 4 is shown in FIG. 2b. The LED chips 4 are shown schematically with two terminals, an anode terminal and a cathode terminal, in each case one cathode terminal being connected to the anode terminal of a neighbouring LED chip by means of an intermediate bond connection 9. The first anode terminal and the final cathode terminal are connected in each case to a housing terminal element 6. This is brought about in turn by means of electrical connections 8 and the bond connection 13.

An advantage of this further development is an increase in the luminous intensity of an LED housing 1 in general. A plurality of LED chips 4 allows multiplication of the emitted light intensity. The series-connected LED chips 4 are here again controlled by way of the housing terminal elements 6. As in the embodiment of FIG. 1, in conjunction with the housing terminal elements 6, the retaining elements 5 provide a plurality of possible ways of mounting the LED housing 1.

Figure 3A:
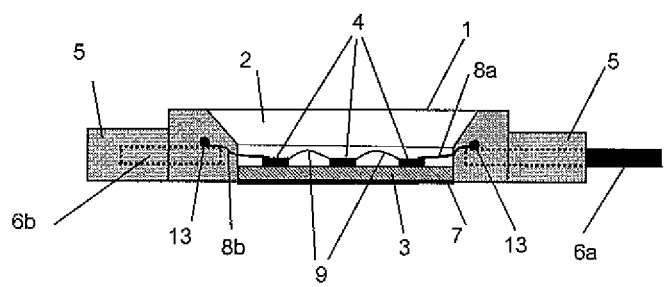
FIG. 3 shows an alternative embodiment to the embodiment of the LED housing shown in FIG. 1.
Figure 3B:
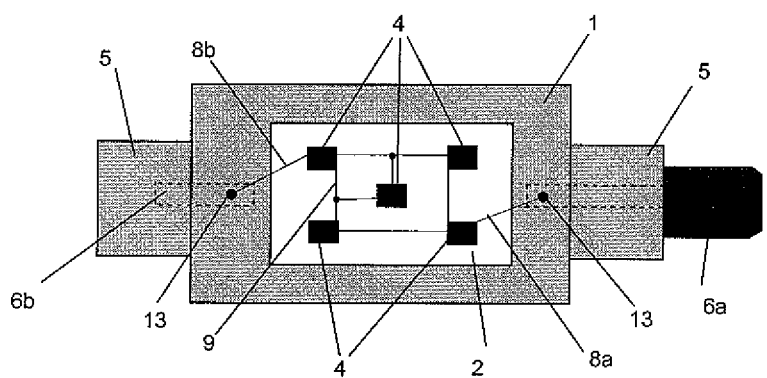

FIG. 3 shows an alternative embodiment to the embodiment of the LED housing shown in FIG. 1. Due to its very considerable similarity to FIGS. 1 and 2, which have already been described, only the characteristic differences from these Figures will be examined here. Unlike in FIG. 1 the housing terminal element 6 here has two different forms, each form being a particular terminal type. In this case the first anode terminal 8a is connected electrically with an anode terminal element 6a and the final cathode terminal is connected electrically with a cathode terminal element 6b.

The housing terminal element 6, in the form of an anode terminal element 6a and cathode terminal element 6b, forms a universal plug-and-socket system. The anode terminal element 6a here has the function of a plug connector and the cathode terminal element 6b here has the function of a socket. An opposite arrangement of plug connector and socket from the described variant is likewise possible. Problem-free series connection of a plurality of LED housings is made possible by this plug-and-socket system.

This plug-and-socket system is advantageously standardised and complies with a standard. Thus, this LED housing may be incorporated without difficulty into an existing plug-and-socket system, for example in the automotive, electronics or appliance fields. Because the retaining element is manufactured as part of the housing, no additional mating component or extra holder is necessary and the LED housing may be used universally. Additional costs are saved in this way and transition losses, which are an ever-present side effect in adapters, are avoided.

As in FIGS. 1 and 2, adequate outward heat transfer, specifically for high power LEDs, is achieved by the heat dissipating element 7. Corresponding electrical and/or mechanical connection to the terminal elements 6a and 6b may in turn also be made preferably in standardised manner by way of plug-and-socket systems, latching systems or screw systems.

Figure 4:
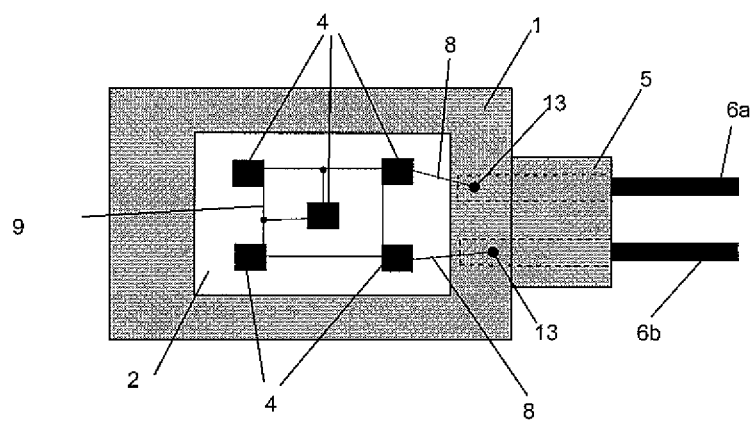
FIG. 4 shows a further development of the embodiment of the LED housing shown in FIG. 3.

FIG. 4 shows a further development of the embodiment of the LED housing illustrated in FIG. 3, the sectional representation here being dispensed with. Once again, only the differences relative to FIG. 3 are examined below. In contrast to the previous Figures, FIG. 4 shows just one retaining element 5, which serves in connecting a plurality of LED housings or in connection with a carrier. The configuration illustrated is electrically contactable with a carrier for example by means of a plug connector, but may also be connected with other LED housings 1. Cathode terminal and anode terminal elements 6a and 6b are separately constructed. This variant is preferably used for mounting in a perforated printed circuit board, or mounted on or inserted into a carrier.

FIG. 5 shows 3D sketches of four further developments of an alternative embodiment of the embodiments of the LED housing shown in FIG. 1. Unlike in FIG. 1, the retaining element may for example be of multipart configuration. The retaining elements 5 in FIG. 5a are for example screw holders and a plug connector mating element. A mechanical retention force with a carrier is thus firstly made possible, but so too is a retention force of a perfectly fitting mating element of the housing terminal element for an electrically conductive connection.

Furthermore, the LED housing 1 in FIG. 5a comprises an optical element 15, which serves in deflecting the electromagnetic radiation here emitted by any one of the LED chips 4. In this way, an optimum radiation pattern is achieved for the respective LED housing in relation to the respective application. Screws are here provided as the connecting elements 14. These serve primarily in mechanical connection with a carrier, in particular a heat sink. Other connecting elements are likewise conceivable and are not excluded from the concept of the invention.

FIGS. 5b to 5d comprise in principle similar elements. What varies, for example, is the form of the optical element, which takes the form in FIGS. 5c and 5d of one element for all the LED chips 4. Furthermore, the housing terminal elements 6, 6a, 6b are differently constructed, FIG. 5d providing a standardised electrical connection, as mentioned above, for example for the automotive sector. On the other hand FIG. 5c shows a variant embodiment for an alternative system.

The holes shown in FIGS. 5a to 5d are here retaining elements 5 and make it clear that the retaining element 5 may be very simply produced as part of the LED housing 1. In addition, the retaining element may consist of a plurality of parts, one part of the holders being attached to a carrier by means of a screw connection. However, the retaining element 5 may comprise other parts 5 for secured connection to another LED housing or a board or a heat sink.

FIGS. 6a, 6b and 6c show further developments of the embodiment shown in FIG. 2 of the LED housing. Unlike in FIG. 2, each LED may be individually controlled. FIG. 6c here in turn shows a variant in which each retaining element 5 comprises a cathode terminal element 6b and anode terminal element 6a. By means of a universal plug-and-socket system, achieved by a specific shaping of the retaining element 5, an extension of the LED housing with an LED housing of identical construction or arrangement on a carrier are simply possible.

FIG. 7 shows further developments of the embodiment of the LED housing shown in FIG. 6. Unlike in the previous Figures, the LED chips 4 in FIG. 7 comprise a control element, not shown, which may be controlled by way of a control terminal element 10 and a control terminal connection 11.

It is possible by way of these further developments to control each LED chip individually, preferably to control the intensity of the electromagnetic light to be emitted. Through control by means of pulse width-modulated signals, for example, individual colour saturation or light intensity may be achieved for each LED chip.

Like the retaining elements 5 and housing terminal elements 6, 6a and 6b, the control terminal elements 10 are freely configurable in form and preferably standardised, in order to allow flexible, quick extension with other LED housings, an electrical connection or control. The same applies to the mounting variants with a carrier.

Connection of the LED chips 4 from FIGS. 1 to 7 with one another preferably proceeds by means of intermediate bond connection, wherein the carrier element may likewise additionally comprise conductor structures, not shown. Connection of the terminal elements 6, 6a and 6b to the respective LED chip terminals 8, 8a and 8b preferably proceeds by means of laser welding methods or conventional wire bonding methods.

The carrier element 3 preferably takes the form of a DBC ceramic substrate, since it has an electrically insulating action by way of its special "sandwich structure" (copper-ceramic-copper) and allows laterally spread heat removal, which makes this substrate into a good thermal conductor.

When using other, in particular not electrically insulating carrier elements 3, the LED chip sides, with which the LED chip 4 is attached to the carrier element 3, have to be electrically insulating.

Materials used for the LED housing are primarily plastics, for example PPA, LCP, PEEK or PEI. The carrier element is in particular a DBC, MKP PCB or AlN ceramics substrate. Metallic carriers, for example copper or copper alloys with bond metallisation, may also be used. In the case of a non-insulating carrier, the LED chips have to be insulated on the rear sides.

The embodiments shown in FIGS. 1 to 7 or their further developments of the LED housing may be freely combined and interchanged.

A further object of the retaining element 5 is the function as spacer if a common carrier is to be used by two LED housings of identical construction. In this case it is important for there to be sufficient distance between the individual LED housings, so that sufficient outward heat transfer is ensured.

Figure 8A:
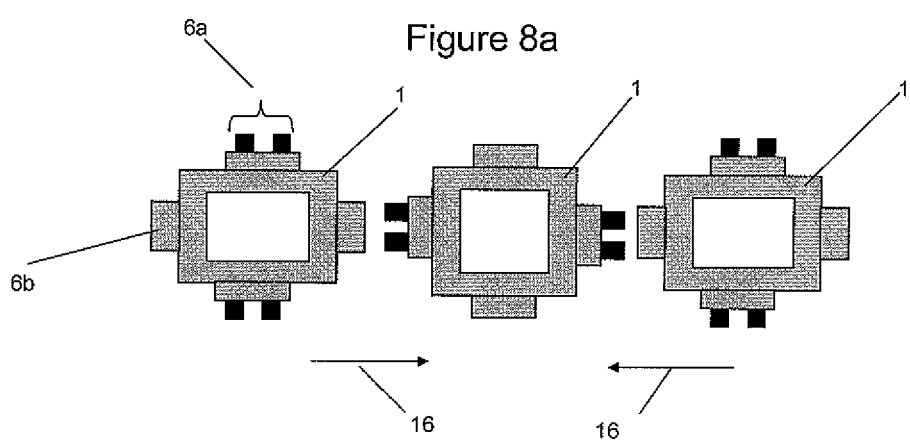
FIG. 8 shows a series connection of three of one of the embodiments and/or further developments shown of the LED housing.
Figure 8B:
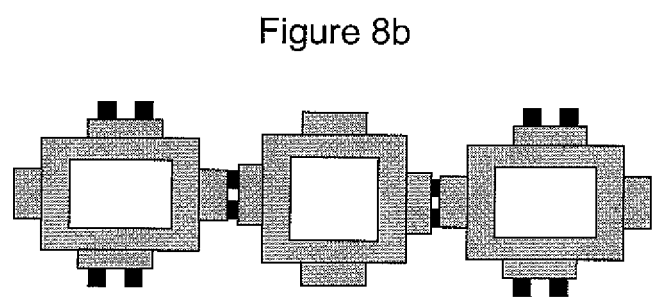

FIG. 8 shows a series connection of three plugged-together LED housings 1. The LED housings 1 are here configured according to one of the embodiments and/or further developments of FIGS. 1-7. They comprise both a cathode terminal element 6b and an anode terminal element 6a and are connected by plugging-together 16, as shown in FIG. 8b. The LED chips not shown here are connected by one of the variant configurations described in FIGS. 1 to 7 and electrically and/or mechanically linked by means of anode terminal element 6a or cathode terminal element 6b. In addition, mounting on a carrier by means of further above-described retaining elements 5 is also feasible.

Figure 9A:
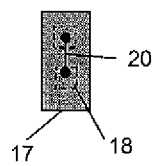
FIG. 9 shows a series and parallel connection of eight of one of the embodiments and/or further developments shown of the LED housing.
Figure 9B:
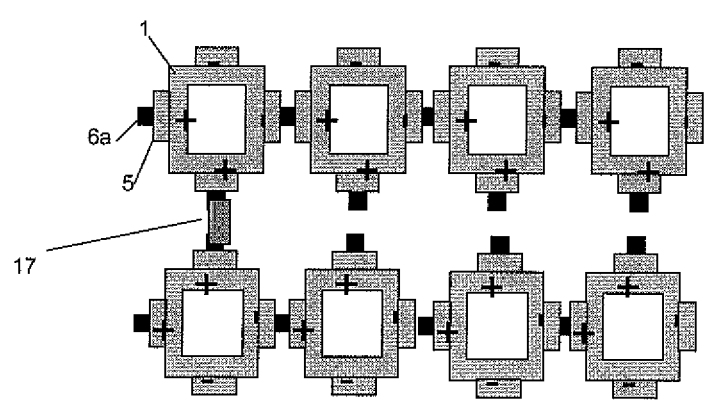

FIG. 9 shows alternative interconnection of individual LED housings 1, parallel connection here being shown of in each case four series-connected LED housings 1. Once again, the LED housings 1 correspond to one of the previously described embodiments and/or further developments. The housing shape with the retaining elements 5 and the housing terminal elements 6 from FIGS. 1 to 7 is shown only schematically. Characteristic of a parallel connection is the connection of two anode terminal elements 6a, which is made possible with an adapter 17 according to the invention. The adapter 17 is shown in FIG. 9a and provides bridging 20 of the two adapter terminals 18. A further object of the adapter 17 is its function as placeholder or spacer for better heat dissipation, if a common heat sink is used for the interconnected LED housings.

Figure 10A:
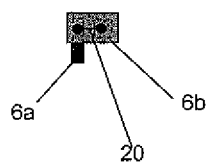
FIG. 10 shows an alternative interconnection variant of one of the embodiments of the LED housing shown in FIG. 6.
Figure 10B:
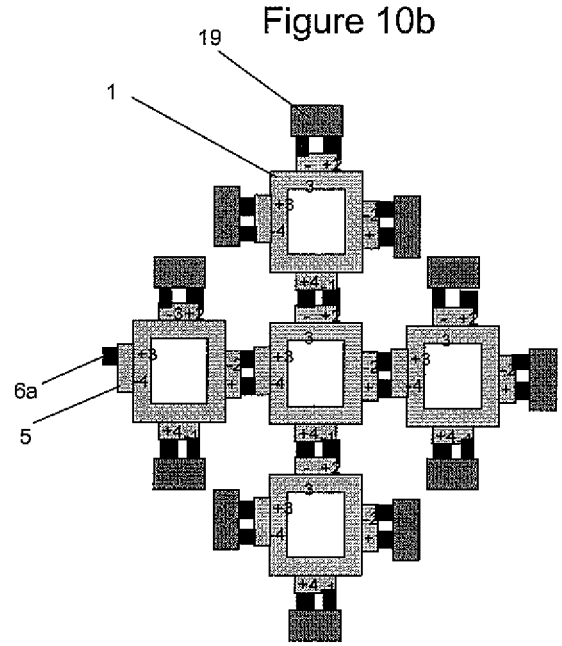

FIG. 10 shows a further alternative interconnection of the LED housings 1 described. Here the LED housings 1 are linked in a star shape, each LED housing comprising a plurality of housing terminal elements 6a and 6b, whereby each individual housing terminal element 6a and 6b controls an LED chip 4 within the housing cavity 2 of a each LED housing 1. In this case each LED housing 1 comprises LED chips 4 which are not shown. To be able to operate all the LED chips 4, a bridge adapter 19 is shown in FIG. 10a, which again merely provides bridging 20 between two terminal elements 6a and 6b. It is a perfectly fitting mating component for the housing terminal element 6a or 6b on each side of an LED housing 1 and comprises an anode terminal element 6a and a cathode terminal element 6b.

To operate the LED chip 4, the bridge adapter shown in FIG. 10a serves in bridging the cathode and anode terminals of the LED to be operated. It may likewise again be used to operate a plurality of LEDs linked in series connection and has merely to be configured by its shaping and optionally for exposure to higher current loads.

Operation of the LED chips 4 and supply of each chip 4 to be operated with power is adapted to the respective interconnection by means of current driver circuits. These current driver circuits regulate a permanently constant operating current necessary for operation. It is also feasible to add and remove LED housings 1 during operation, wherein a short-circuit or overload scenario may accordingly be taken into account and ruled out by the current driver circuits.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An LED housing having a housing cavity, a carrier element, at least one LED chip, at least one retaining element and at least one housing terminal element, wherein:
    the carrier element and the at least one LED chip are arranged inside the housing cavity in the LED housing,
    the LED chip is arranged on a first upper side of the carrier element and the LED housing is shaped in such a way that:
        the at least one housing terminal element is arranged on an outer side of the LED housing and comprises an electrical connection to the at least one LED chip for operating this LED chip, and
        the LED housing is adapted to be mechanically and detachably connected to a second LED housing of identical construction,
    wherein the LED housing is adapted to be mechanically and detachably connected with a carrier by the at least one retaining element,
    wherein said retaining element is a hole in the LED housing through which a mechanical connecting element is guidable,
    wherein the mechanical connecting element is free of electrical current for driving the at least one LED chip during operation of the at least one LED chip.

2. The LED housing according to claim 1,
    wherein the LED housing is adapted to be connected mechanically and/or electrically to a second LED housing of identical construction mechanically detachably by the at least one retaining element.

3. The LED housing according to claim 1,
    wherein the LED housing comprises a heat dissipating element on at least one second side of the carrier element opposite the first, upper side.

4. The LED housing according to claim 1,
    wherein the at least one retaining element is of multipart construction and at least one part of the retaining element contains the housing terminal element.

5. The LED housing according to claim 1,
    wherein the housing terminal element comprises at least one anode terminal element and one cathode terminal element, wherein the anode terminal element and the cathode terminal element form a mechanical and/or electrical plug-and-socket system.

6. The LED housing according to claim 1,
    wherein the LED housing is SMT-mountable and the housing terminal elements are controllable by way of plug-and-socket connection and/or latching connection.

7. The LED housing according to claim 1,
wherein the LED housing comprises a control terminal element and this control terminal element comprises an electrical connection to at least one control element inside the housing cavity, wherein each control element controls the intensity of the electromagnetic radiation emitted by one of the LED chips.

8. The LED housing according to claim 1,
wherein the LED housing is electrically contacted via the housing terminal element by means of plug-and-socket connection, insulation displacement connection and/or cage clamp springs.

9. The LED housing according to claim 1,
wherein parts of the retaining element make the LED housing mechanically connectable with LED housings of identical construction by means of screw, plug-and-socket and latching connection.

10. The LED housing according to claim 1, comprising:
the at least one retaining element, which is configured as a screw holder and which allows LED housings to be connected mechanically to the carrier by means of the at least one mechanical connecting element taking the form of a screw, which connecting element engages in the retaining element, and
a housing terminal element with which the LED chip is adapted be electrically contacted, wherein the housing terminal element is arranged laterally on the LED housing.

11. The LED chain comprising a plurality of LED housings according to claim 1, wherein:
the LED housings are fastened to the carrier on their underside remote from the LED chip, and
at least two of the LED housings are connected together electrically conductively by means of in each case one housing terminal element, wherein at least one housing terminal element is arranged laterally on each of the LED housings.

12. An LED housing having a housing cavity, a carrier element, at least one LED chip, at least one retaining element and at least one housing terminal element, wherein:
the carrier element and the at least one LED chip are arranged inside the housing cavity in the LED housing,
the LED chip is arranged on a first upper side of the carrier element and the LED housing is shaped in such a way that:
the at least one housing terminal element is arranged on an outer side of the LED housing and comprises an electrical connection to the at least one LED chip for operating this LED chip, and
the LED housing is adapted to be mechanically and detachably connected to a second LED housing of identical construction,
wherein the LED housing is SMT-mountable and the housing terminal elements are controllable by way of plug-and-socket connection and/or latching connection.

* * * * *